(12) United States Patent
Nelson

(10) Patent No.: US 10,025,552 B2
(45) Date of Patent: Jul. 17, 2018

(54) SELECTIVE LOCKING OF INPUT CONTROLS OF A PORTABLE MEDIA PLAYER

(71) Applicant: Varia Holdings LLC, Brooklyn, NY (US)

(72) Inventor: Jonathan Nelson, Seattle, WA (US)

(73) Assignee: Varia Holdings LLC, Brooklyn, NY (US)

(*) Notice: Subject to any disclaimer, the term of this patent is extended or adjusted under 35 U.S.C. 154(b) by 0 days.

(21) Appl. No.: 14/463,611

(22) Filed: Aug. 19, 2014

(65) Prior Publication Data

US 2014/0354576 A1 Dec. 4, 2014

Related U.S. Application Data

(63) Continuation of application No. 11/971,058, filed on Jan. 8, 2008, now Pat. No. 8,843,222.

(60) Provisional application No. 60/883,996, filed on Jan. 8, 2007.

(51) Int. Cl.
| | |
|---|---|
| *G06F 3/16* | (2006.01) |
| *G11B 19/02* | (2006.01) |
| *G06F 17/30* | (2006.01) |
| *G07C 9/00* | (2006.01) |
| *H03G 3/02* | (2006.01) |

(52) U.S. Cl.
CPC .......... *G06F 3/165* (2013.01); *G06F 17/3074* (2013.01); *G07C 9/00126* (2013.01); *G11B 19/022* (2013.01); *H03G 3/02* (2013.01)

(58) Field of Classification Search
CPC .. H04M 2250/22; H04M 1/663; H04M 1/673; H04M 1/72522; H04M 1/67; G06F 3/017; G06F 3/03547; G06F 3/038; G06F 3/0484; G06F 3/04842; G06F 3/0488; G06F 3/04883; G07C 9/00126
USPC ............................................ 700/94; 455/3.06
See application file for complete search history.

(56) References Cited

U.S. PATENT DOCUMENTS

| | | | |
|---|---|---|---|
| 7,657,849 B2 | 2/2010 | Chaudhri et al. | |
| 2003/0034185 A1* | 2/2003 | Kaikuranta | G06F 3/03547 178/18.01 |
| 2006/0112428 A1* | 5/2006 | Etelapera | G11C 7/24 726/16 |
| 2007/0135091 A1 | 6/2007 | Wassingbo | |
| 2007/0255752 A1 | 11/2007 | Miller | |
| 2008/0055276 A1* | 3/2008 | Chang | G06F 3/0488 345/175 |
| 2008/0259038 A1* | 10/2008 | Hokkanen | G06F 3/023 345/169 |
| 2011/0081889 A1* | 4/2011 | Gao | G06F 3/038 455/411 |

\* cited by examiner

*Primary Examiner* — Andrew C Flanders
(74) *Attorney, Agent, or Firm* — Schwabe, Williamson & Wyatt, P.C.

(57) ABSTRACT

A portable media player configured to selectively enable or disable one or more input controls, such as volume controls, is described herein. In some examples, the player contains a physical button or switch that provides for the selective enabling or disabling of input controls. In some examples, the player is configured to dynamically determine when to enable or disable input controls based on information received about the player or characteristics of the player. Other embodiments are also described and claimed.

20 Claims, 3 Drawing Sheets

SELECTIVE LOCKING OF INPUT CONTROLS OF A PORTABLE MEDIA PLAYER

CROSS REFERENCE TO RELATED APPLICATIONS

This application is a continuation of U.S. patent application Ser. No. 11/971,058, filed Jan. 8, 2008, which claims priority to U.S. Provisional Patent Application No. 60/883,996, filed on Jan. 8, 2007, entitled SELECTIVE LOCKING OF INPUT CONTROLS FOR A PORTABLE MEDIA PLAYER, SUCH AS THE SELECTIVE LOCKING OF VOLUME CONTROLS, which is incorporated by reference in its entirety.

BACKGROUND

Portable media players are increasing in popularity. A portable media player is a transportable device that plays one or more media file types, including text, audio, video, graphics, animation, images, interactive, and other media file types.

At times, a user may wish to carry and interact (e.g. listen to music) with a portable media player without carrying the player in his/her hand. Therefore, users often carry portable media players in accompanying articles, such as in pockets of clothing, handbags, backpacks, holsters, carrying cases, and so on. For example, a user may place a portable media player in a pocket in his/her jeans while listening to music playing from the player via a set of headphones.

In order to prevent the reception of unwanted inputs being received by a player, many players provide a locking mechanism that causes the player to ignore or otherwise not receive any input commands normally received via external input controls, such as buttons, scroll wheels, touchpads and so on. Locking a player disables input controls and eliminates the receipt of inadvertent inputs that affect the playback of the player, such as when the player collides with another article in a pocket or bag. However, many users may be undesirably restricted by current player locking mechanisms.

These and other problems exist with respect to portable media players.

DETAILED DESCRIPTION OF ILLUSTRATIVE EMBODIMENTS

Figure 1:
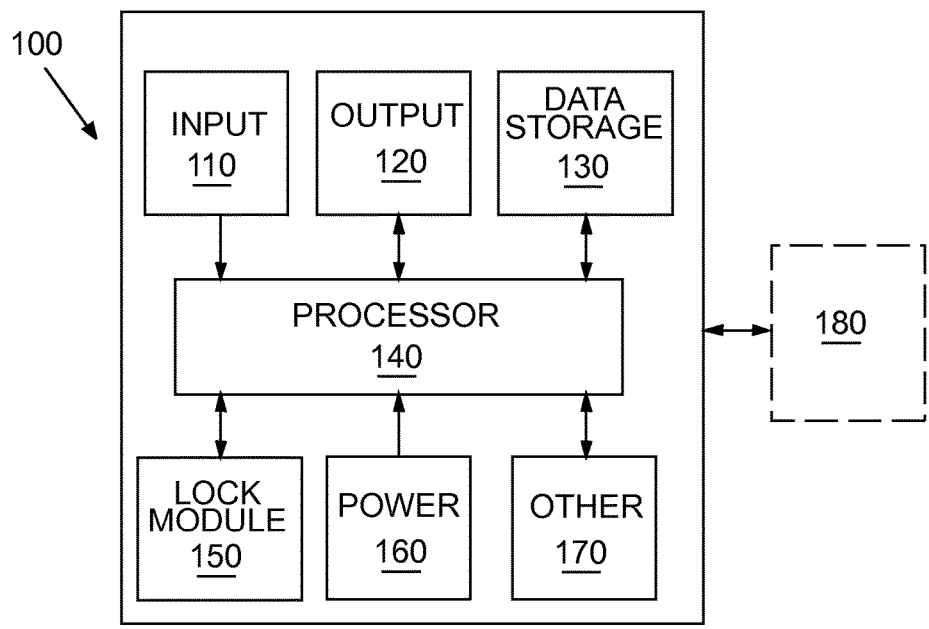
FIG. 1 is a block diagram illustrating example components of a portable media player, in accordance with various embodiments.

A method and system for the selective locking of user controls in a portable media player is described. The system may receive a user command to lock the player, such as via a user pushing or sliding a button or selecting a menu option, and selectively lock one or more input controls located at least in part at an external surface of the player. In some cases, the system, upon receiving an indication of the user command, ignores inputs received from a pre-selected set of input controls. For example, the system may ignore all input controls except for the controls that determine the volume of playback of media containing audio information. In some cases, the system, upon receiving an indication of the user selection, ignores inputs received from a set of user-selected input controls. For example, the system may allow users to pre-select one or more input controls to maintain as active even when the player is locked. In addition to selectively locking one or more input controls on the player, the system may facilitate the selective locking and unlocking of controls on plug-in modules to the player as well. The selective locking of controls when a player is in a locked state, and the unlocking of controls when the player is in an unlocked state, greatly improves the user experience with a player.

In some embodiments, the system allows volume controls to be used even though other controls are disabled when the portable media player is in a locked state. Users may want to raise or lower the volume when other controls are disabled, such as controls that affect the playback of the device. That way, a user is able to quickly retrieve his/her portable media player, adjust the volume, and place the portable media player back where the player was being stored. The system alleviates the cumbersome experience of first unlocking and later re-locking the player when a user merely wants to adjust the volume. The system is particularly valuable to users because the desired volume or recorded sound levels may vary significantly between media, and a user may frequently find himself/herself changing the sound volume to achieve a desired level.

In some embodiments, the system allows lighting and other indicator controls to be used even though other controls are disabled when the portable media player is in a locked state. For example, a user running with a player attached to his/her arm may wish to quickly turn on an indicator such as a backlight to see the time, the status of playback, the status of his/her run (for those players that interact with users in such a way) or other information, without disrupting media playback or other active applications of the player (such as applications monitoring or collecting data about the user). By permitting an indicator control to remain enabled, the system allows the user to view information via the backlight without having to unlock and re-lock the player, inconveniencing the user and possibly altering active applications running on the player.

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section.

FIG. 1 is a block diagram illustrating example components of a portable media player 100, in accordance with various embodiments. Portable media player 100 may include an input component 110 that receives user input from one or more input controls, such as buttons, scroll wheels, touchpads, and so on. For example, player 100 may receive an adjustment to playback volume via input component 110. Portable media player may also include an output component 120, such as an audio playback module, a display module, a vibrate module, a light module, and so on, and a data storage module 130. Data storage module 130 may be a magnetic media drive, optical media drive, other non-volatile memory, flash memory, and so on, capable of storing audio media, video media, image media, and other media types for playback via output component 120. Player may also include a processing component 140, a power component 160, and other components 170, such as wireless communication components, telephone components, data and information collection components, playback monitoring components, and so on, for the implementation of various features and functions.

Portable media player 100 may also connect to plug-in modules 180 and other added components. For example, plug-in modules 180 may include modules that detect location of the player (such as a GPS module), environmental conditions, conditions of a user (such as a heart rate monitor, pedometer, and so on), and other modules. The portable media player 100 may control some or all of the functions of the plug-in modules using input component 110.

Player 100 may also include a lock module 150 that may restrict or ignore selected input commands, while continuing to allow certain input commands, typical a small subset, received from input controls via the input component 110. The player, in particular, lock module 150, alone or in association with other components, may predetermine the input controls to be ignored and/or allowed, or may allow users to select one or more input controls to be ignored and/or allowed, when the player is placed into a lock state.

Figure 2:
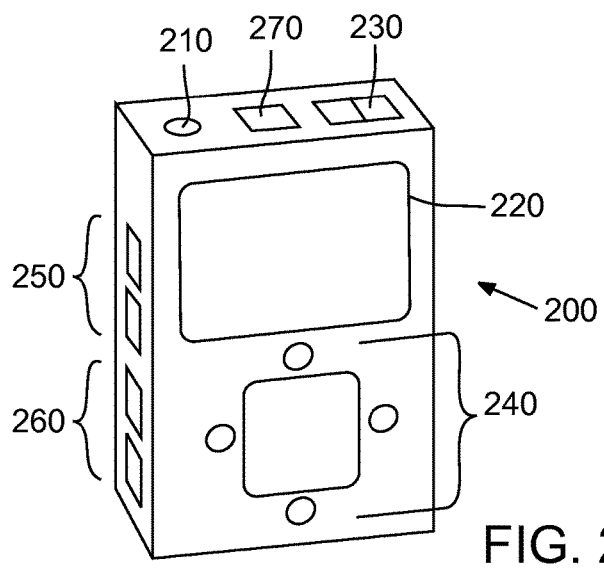
FIG. 2 is a block diagram illustrating an example portable media player, in accordance with various embodiments.

The placement of certain input controls may affect the selection of which controls should be locked (or remain unlocked) during a locked state. FIG. 2 is a block diagram illustrating an example portable media player 200, in accordance with various embodiments. Player 200 may include one or more output elements housed in a housing, such as an audio output component 210 (e.g., a headphone jack), and a display screen 220. In various embodiments, the housing is palm-sized for portability. Player 200 may also include a locking input control housed in the same housing, such as sliding switch 230. Moving the switch to a first position selectively disables certain input controls of the device, while moving the switch to a second position enables all input controls of the device. Of course, other input controls may be used to lock a device, such as soft-keys, buttons, touchpads, and so on. Furthermore, player 200 may include various input controls, such as a touchpad and/or buttons 240 contained on the same surface as the display screen 220, buttons 250 and 260 contained on side a portion of the player, button 270 contained on a top portion, and others (such as buttons or other input controls contained on a lower portion or on a reverse or back portion).

Various input controls may be enabled or disabled when the player is placed into a locked state. For example, input controls 240 may be used in determining media to playback to a user, while buttons 250 may be used to control the volume of playback. When a user decides to place the player 200 in a locked state using control 230, the player may lock buttons 240 but maintain buttons 250 in an unlocked state. When in the locked state, the user is thereby able to change the volume of the player without having to unlock and re-lock the player. Additionally, the player may choose to enable more than one button or set of buttons during a locked state. The player may maintain buttons 250, 260, and 270 in an unlocked state while locking input controls 240. Thus, the user is able to perform peripheral operations, such as changing volume, illuminating indicators, and so on, without disrupting the ongoing playback of the device. For example, the user may press button 260 to illuminate the display and view the song currently being played, without having to first unlock the player to do so. As another example, if button 270 is used to turn the player 200 on and off, the user may use button 270 to turn a player off without having to first unlock the player to do so.

The determination of which controls are locked or operational when a player is in a locked state may be pre-selected by the player manufacturer. The player may also allow users to determine which controls are selectively enabled when a player is placed into the locked state. A user may select these controls during an initial set up of his/her player, during soft-key or menu navigation of the player, and so on. The player may also facilitate user selection via media service applications that provide media to the player. The operational controls may be selected on an individual basis, or the player may offer a user various modes to select from (e.g., "walking," "working out," "traveling"), each of which may have a different set of controls that are enabled in the locked state.

Those skilled in the art will appreciate that it may not be necessary to lock certain input controls because of the construction of the controls or the placement of the controls. Buttons 250, 260 and/or 270 may be flush with the surface, and may contain tactile elements to facilitate a user to blindly find the buttons. Locating the buttons on a portion away from the display, or flush to the surface, may prevent many inadvertent pushes when player 200 is stored in a pocket, case, or bag. Additionally, buttons 250, 260, 270 may be less sensitive to input, further preventing inadvertent receipt of input by the player.

In some embodiments, the player may provide enhanced volume-control functionality to selected buttons, such as buttons 250, 260, 270. For example, a short press of a button associated with increasing volume may incrementally lower the volume, while depressing and holding the button for a certain time may mute the player. Additionally, while a quick press of a button associated with increasing volume may incrementally increase the volume, depressing and holding the button for a certain time may move the player to a pre-set volume or to full volume. The player may implement such volume-control functionality in conjunction with the selective locking of input controls. For example, there may be occasions when unlocked volume controls are inadvertently pressed, causing the player to switch to a volume that is louder than desired by a user. Should this happen, the volume-control functionality enables the user to hold down the decreasing volume control to quickly mute the device and remedy the situation.

Figure 3A:
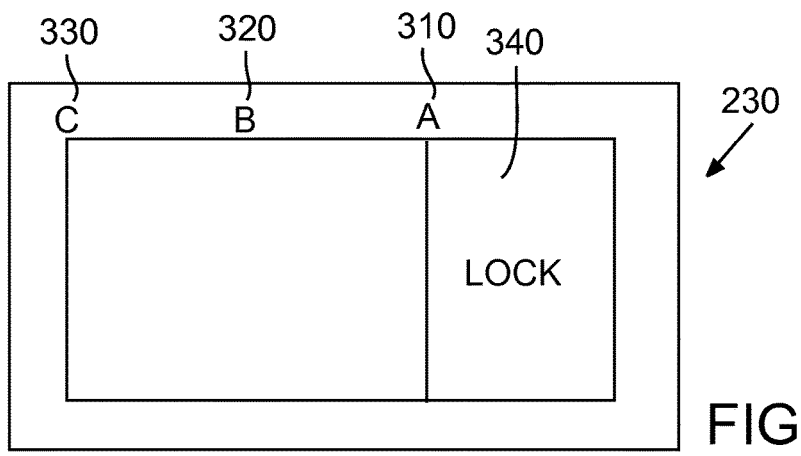
FIGS. 3A-3C are block diagrams illustrating an input control used in locking a portable media player, in accordance with various embodiments.
Figure 3B:
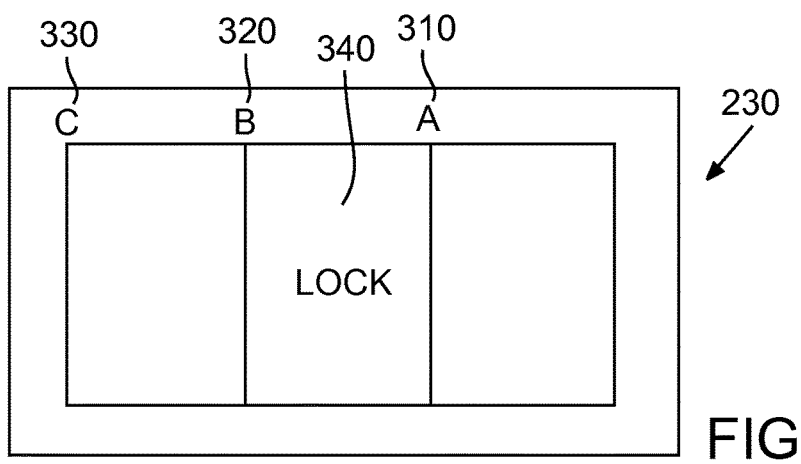
Figure 3C:
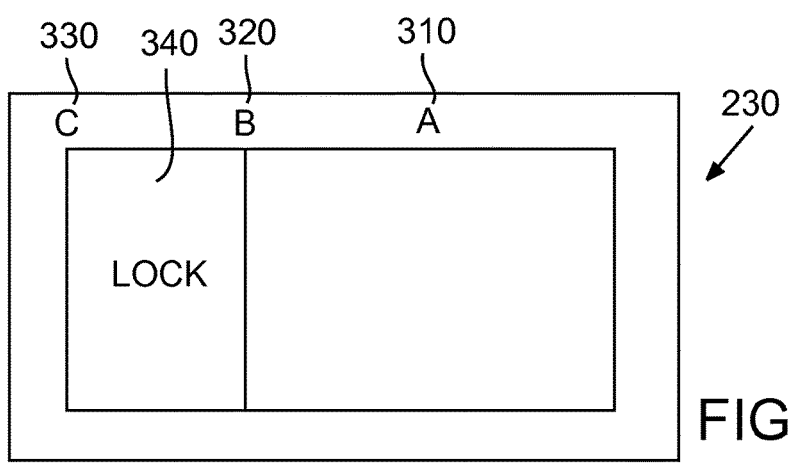

In some cases, the player may wish to provide both a selectively-locked state as well as a fully-locked state. The player may enable users to choose between a fully-locked state, where all input controls are disabled, and a selectively-locked state, where some input controls are disabled, or an unlocked state. The player may enable users to select the state, using buttons, sliding mechanisms, soft-keys, and so on. For example, FIGS. 3A-3C are block diagrams illustrating an input control 230 used in locking a portable media player, in accordance with various embodiments. In FIG. 3A, a sliding mechanism 340 is in position A, placing the player in an unlocked state 310 In FIG. 3B, the sliding mechanism 340 has been moved to position B, placing the player in a selectively-locked state 320. In FIG. 3C, the sliding mechanism has been moved to position C, placing the player in a fully-locked state 330 where all input controls are disabled. Thus, the player provides users with options to quickly and easily set a player into a locked or selectively-locked state.

Alternatively, the player may predictively and automatically select a fully-locked state, selectively-locked state, or unlocked state, based on a current use of the player. For example, the player may switch to a selectively-locked state if a user has not used touchpad and/or buttons 240 for a certain period of time.

Figures 4, 5:
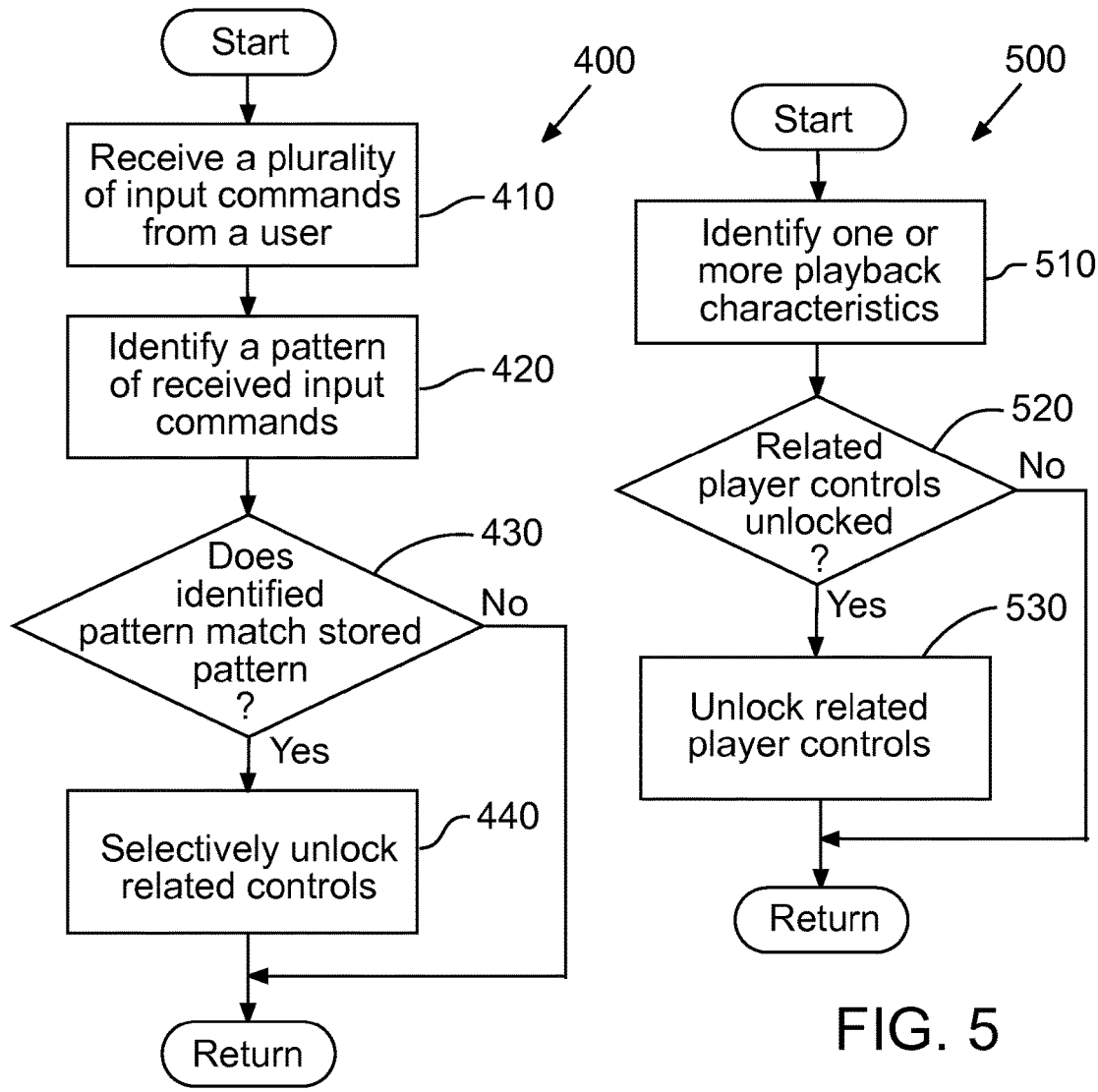
FIG. 4 is a flow diagram illustrating a routine for selectively unlocking input controls due to previous detected inputs, in accordance with various embodiments.
FIG. 5 is a flow diagram illustrating a routine for selectively unlocking input controls due to characteristics of playing media, in accordance with various embodiments.

In addition to the input control 230 described herein, other mechanisms may be configured to cause the portable media player 100 to selectively disable or enable certain input controls. In some cases, the player may unlock one or more locked input controls upon detection of previous input patterns. Referring to FIG. 4, a flow diagram illustrating a routine 400 for selectively unlocking input controls due to previous detected inputs, in accordance with various embodiments, is shown. In operation 410, the player receives a plurality of input commands from a user of a portable media player 100. For example, the player may be in a fully locked state, and the user may unlock the player and reduce the volume of playback, and then relock the player. The user may subsequently unlock the player and increase the volume of playback, and then relock the player.

In operation 420, the player determines a pattern of received input commands. For example, the player may identify that the most recent input commands have been unlock, reduce volume, relock, and unlock, increase volume, relock. In operation 430, the player analyzes the determined pattern in view of stored patterns, e.g. determining whether the pattern matches or partially or fully matches a stored pattern. For example, the player looks to a database of possible input command patterns, and determines that the identified pattern in operation 420 matches a similar pattern stored in a database in the player. What constitutes matching may be application dependent. Additionally, the player may determine that the identified pattern contains a similar pattern (for example, the database may have a pattern of "relock, unlock") stored in the database. The player may identify patterns based on input commands, timing of commands, relative position of commands, and so on.

When the player matches the identified pattern, routine 400 proceeds to operation 440, else routine 400 ends. In operation 440, the player selectively enables input controls related to the matched pattern. In this example, the player enables the volume controls of the player 100, as the player has determined that the input commands received from the user relate to use of volume controls. Optionally, the player may provide an indication to the user that the input controls are enabled. For example, the player may send an audio message to the user, or may display an indication on a display of the player, that the volume controls have been unlocked.

Routine 400 may also facilitate the selective disabling of input controls on a portable media player 100. The player may receive one or more input commands related to inadvertent input commands, and lock the player after receiving such commands. For example, the player may receive an input command to increase the volume of the player, followed shortly thereafter by an input command to reduce the volume of the player. The player may identify a pattern of "increase volume, decrease volume" within a certain time period, and match that pattern with a stored pattern that relates to the selective locking of the volume controls. The player may then disable the volume controls of the player and provide an indication to the user that the volume controls are disabled.

Routine 400 may apply to input controls that receive input commands related to changing multiple functions of a portable media player. For example, many players include a touchpad or scroll wheel that receive input commands related to increasing or reducing the volume of the player (such as by sliding a finger across or around the touchpad) and relate to navigating a playback menu (such as by pressing down on a portion of the touchpad). In these cases, routine 400 may receive input commands that indicate inadvertent sliding of the touchpad, match these commands to a stored pattern, and disable any input commands received at the touchpad due to the sliding mechanism. Thus, the player is able to selectively and dynamically disable some commands received by an input command that may be inadvertent while enabling other input commands that are rarely inadvertently received.

In addition to dynamically enabling/disabling input controls based on previously received commands, the player may also facilitate the dynamic enabling/disabling of input commands based on characteristics of playback of media from the device. Referring to FIG. 5, a flow diagram illustrating a routine 500 for selectively unlocking input controls due to characteristics of playing media, in accordance with various embodiments, is shown.

In operation 510, the player identifies one or more playback characteristics related to media playing on a portable media player 100. For example, the player identifies that the media player has begun playing a song that is 50 percent louder than the previously played song. In operation 520, if the player determines that one or more input controls related to the identified playback characteristics are disabled, routine 500 proceeds to operation 530, else routine 500 ends.

In operation 530, the player enables the related player controls. For example, the player enables the input control related to volume (or, perhaps only the input control related to reducing volume). The player may enable the input control until a user provides an input command (in this case, reduces the volume of the player using the control) and then disable the control. Thus, the player may be able to anticipate the needs of users of the portable media player, and enable or disable input controls in advance of those needs.

The above detailed description of the technology is not intended to be exhaustive or to limit the technology to the precise form disclosed above. While specific embodiments of, and examples for, the technology are described above for illustrative purposes, various equivalent modifications are possible within the scope of the technology, as those skilled in the relevant art will recognize. For example, while processes or blocks are presented in a given order, alternative embodiments may perform routines having operations, or employ players having blocks, in a different order, and some processes or blocks may be deleted, moved, added, subdivided, combined, and/or modified. Also, while processes or blocks are at times shown as being performed in series, these processes or blocks may instead be performed in parallel, or may be performed at different times. Each of these processes or blocks may be implemented in a variety of different ways.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. An apparatus, comprising:
a selection input to receive individual selections of one or more control components out of a plurality of control components of the apparatus during a control component configuration for an individual operational mode of a plurality of operational modes, the individual selections of the one or more control components to remain enabled when the apparatus is in a locked state during the individual operational mode such that the apparatus is to continue to be able to receive input from the individual selections of the one or more control components when the apparatus is in the locked state during the individual operational mode and not able to receive input from the individual selections of the one or more control components when the apparatus is in the locked state during another individual operational mode of the plurality of operational modes;
a first control component of the plurality of control components;
a second control component of the plurality of control components; and
a control selection component to cause the apparatus to be switched between a locked state and an unlocked state upon activation of the control selection component, wherein:
while the apparatus is in the locked state during the individual operational mode with the first control component having been selected via the selection input, but not the second control component, the apparatus is prevented from acting on any received input from the second control component but is allowed to act on any received input from the first control component,
while the apparatus is in the locked state during the other individual operational mode with the first control component having been selected via the selection input, but not the second control component, the apparatus is prevented from acting on any received input from the first control component and from the second control component, and
while the apparatus is in the unlocked state, the apparatus is allowed to act on any received input from the first control component and from the second control component, regardless of whether the first or second control component has been selected via the selection input.

2. The apparatus of claim 1, further comprising a media playback component to selectively play one or more media files accessible by the apparatus.

3. The apparatus of claim 2, wherein the first control component is to receive input to modify a volume level associated with a selective play of the one or more media files.

4. The apparatus of claim 1, wherein the selection input is to receive input identifying the individual operational mode and to initiate the control component configuration for the individual operational mode.

5. An apparatus, comprising:
one or more buttons to receive input from a user;
a selection input to receive, from the user during configuration of an individual operational mode of a plurality of operational modes, an individual selection of a set of buttons button of the one or more buttons, wherein the selection of the set of buttons is for continued receipt of input via the selected set of buttons when the apparatus is in a locked state and in the individual operational mode,
wherein, in the locked state during the individual operational mode, the apparatus is to:
act on any received input from the selected set of buttons; and
prevent action on any received input from unselected ones of the one or more buttons; and
wherein, in the locked state during another individual operational mode of the plurality of operational modes, the apparatus is to:
prevent action on any received input from the selected set of buttons; and
prevent action on any received input from unselected ones of the one or more buttons; and
an input lock controller to place the apparatus in the locked state when the input lock controller is selected by the user.

6. The apparatus of claim 5, further comprising:
an audio playback component to control output of audio of stored media files to the user; and
a volume component, coupled to the audio playback component, to adjust a loudness of the presented audio, wherein the volume component is controlled by the one or more buttons.

7. The apparatus of claim 5, further comprising a switch, wherein the input lock controller is selected by the user via the switch.

8. The apparatus of claim 5, wherein the input lock controller is to receive selection by the apparatus receiving a pattern of inputs from the user via the one or more buttons.

9. The apparatus of claim 5, wherein the selection input is to receive the selection of the selected button during an initial setup of the apparatus.

10. The apparatus of claim 5, wherein the selection input is to receive input from the user identifying the individual operational mode and to initiate the configuration of the individual operational mode.

11. A method of controlling an apparatus, the method comprising:
receiving, by the apparatus during a setup procedure for a first operational mode of a plurality of operational modes, an individual selection of a first input component out of a plurality of input components of the apparatus, wherein the selected first input component is an input component to continue to act on received input when the apparatus is placed in a locked state during the first operational mode;
receiving, by the apparatus during a setup procedure for a second operational mode of the plurality of operational modes, an individual selection of a second input component out of the plurality of input components of the apparatus, wherein the selected second input component is an input component to continue to act on received input when the apparatus is placed in a locked state during the second operational mode;
receiving, by the apparatus, an indication to place the apparatus in the locked state;
placing, by the apparatus, the apparatus in the locked state by:
disabling, by the apparatus, the apparatus from acting on any received input from unselected input components of the plurality of input components for a current operational mode of the apparatus;

receiving, by the apparatus, input from a user at the first input component or at the second input component of the apparatus while the apparatus is in the locked state;

performing, by the apparatus, at least one action based on the received input at the first input component while the apparatus is in the locked state and when the current operational mode is the first operational mode; and performing, by the apparatus, at least one action based on the received input at the second input component while the apparatus is in the locked state and when the current operational mode is the second operational mode.

12. The method of claim 11, wherein the apparatus is a portable media player and a functionality comprises a playback volume of the portable media player or lighting of a screen of the portable media player.

13. The method of claim 11, wherein the apparatus setup procedure is to take place during an initial setup of the apparatus or after the initial setup of the apparatus.

14. The method of claim 11, wherein receiving the individual selection of the first input component comprises receiving input from the user identifying the first operational mode and to start the setup procedure for the first operational mode, and wherein receiving the individual selection of the second input component comprises receiving input from the user identifying the second operational mode and to start the setup procedure for the second operational mode.

15. The apparatus of claim 2, wherein the second control component is to receive input to change a status of a selective play of the one or more media files.

16. The apparatus of claim 1, wherein the control component configuration is to take place during an initial setup of the apparatus or after the initial setup of the apparatus.

17. An apparatus, comprising:
an input system to:
receive, for configuration of a first mode of operation, individual selections of one or more first control components out of a plurality of control components of the apparatus, the selected one or more first control components to remain enabled when the apparatus is placed in a locked state such that the apparatus is to continue to receive input from the selected one or more first control components when the apparatus is in the locked state during the first mode of operation while unselected ones of the plurality of control components are disabled when the apparatus is in the locked state, receive, for configuration of a second mode of operation, individual selections of one or more second control components out of the plurality of control components of the apparatus, the selected one or more second control components to remain enabled when the apparatus is in the locked state such that the apparatus is to continue to receive input from the selected one or more second control components when the apparatus is in the locked state during the second mode of operation while unselected ones of the plurality of control components are disabled when the apparatus is in the locked state, wherein the first mode of operation is different than the second mode of operation, and receive a mode of operation selection to activate the first mode of operation or the second mode of operation; and a locking system to cause the apparatus to be placed in the locked state in response to receipt of a locking input and placed in an unlocked state in response to receipt of an unlocking input.

18. The apparatus of claim 17, wherein the locking system comprises a mechanical switch, wherein the locking system is to receive the locking input and the unlocking input via manipulation of the mechanical switch.

19. The apparatus of claim 17, wherein receipt of the locking input and the unlocking input is based on a pattern of received input commands from one or more buttons or from one or more touch inputs.

20. The apparatus of claim 17, wherein the configuration of the first mode of operation or the configuration of the second mode of operation is to take place during an initial setup of the apparatus or after the initial setup of the apparatus.

* * * * *